United States Patent [19]

Wang

[11] 4,350,755
[45] Sep. 21, 1982

[54] AUGER MICROLITHOGRAPHY

[76] Inventor: Chia-Gee Wang, P.O. Box 211, Millwood, N.Y. 10546

[21] Appl. No.: 171,573

[22] Filed: Jul. 23, 1980

[51] Int. Cl.³ .................. G03C 5/00; G03C 5/04; G21G 5/00
[52] U.S. Cl. .................. 430/264; 430/317; 430/323; 430/967; 250/492.1; 250/492.2
[58] Field of Search ............. 430/264, 317, 323, 966, 430/967; 250/492 R, 492 A

[56] References Cited

U.S. PATENT DOCUMENTS

| | | | |
|---|---|---|---|
| 3,960,560 | 6/1976 | Sato | 430/5 |
| 3,963,497 | 6/1976 | Kosti | 430/966 |
| 3,966,473 | 6/1976 | Sato | 430/5 |
| 4,056,395 | 11/1977 | Sato et al. | 430/323 |
| 4,113,486 | 9/1978 | Sato | 430/323 X |
| 4,119,855 | 10/1978 | Bernacki | 250/492 R |
| 4,177,071 | 12/1979 | Brabandere et al. | 430/966 X |
| 4,246,328 | 1/1981 | Sata et al. | 430/323 X |
| 4,260,670 | 4/1981 | Burns | 430/967 |

*Primary Examiner*—Richard Schilling
*Attorney, Agent, or Firm*—Strimbeck, Davis & Soloway

[57] ABSTRACT

Relatively monochromatic soft X-rays at 4.5 m$\mu$ is used to induce auger electrons from the silver-halide crystal to sensitize the photosensitive grain, and the exposed crystal is developed into a fine silver grain. The pattern of the silver grains with sizes of about 0.02$\mu$ can be used as a photoresist with a resolution of about 0.1$\mu$. The silver grains can also be used to initiate certain organic compounds for the resist, also with a resolution of the order of 0.1$\mu$.

10 Claims, 1 Drawing Figure

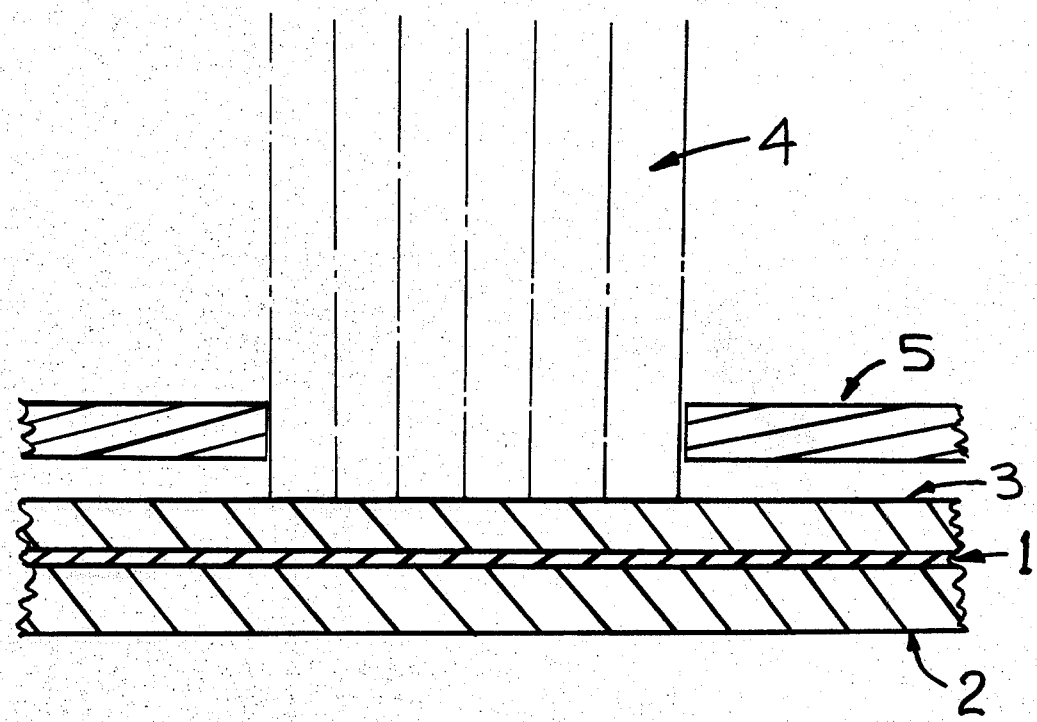

AUGER MICROLITHOGRAPHY

As used herein "silver halide" shall be construed to exclude "silver fluoride".

The present invention relates to a method of producing a photoresist on a silicon wafer and a silicon wafer having a photoresist layer thereon.

The developments of microelectric chips during the past two decades (see, for example, the May 30, 1980 issue of Science, 208, 1019) has brought about great sophistication of photofabrication techniques, if not fabrication principles. Present standard technology using white light produces mask and resist with a resolution of about one micron. Using U.V. light, the best resolution for the mask can be one-half micron. Using X-rays and silver grains, the resolution for the mask can be greatly improved. With X-rays, the resolution of the resist is also improved, but to a lesser degree. The photoabsorption cross section decreases over three orders of magnitude every ten fold increase of photon energy, therefore, finding the proper chemicals for X-ray irradiation and reducing the exposure time remain key problems for mass production. For photolithography, the fundamental limit in resolution is twice the wavelength of the ultraviolet light. Researchers are experimenting with 2600- to 2000-angstrom deep ultraviolet radiation in place of the 4000-angstrom near ultraviolet of commercial instruments. The problem is that the resolution is only one of the areas of concern. Others include depth of field and field width. If the depth of field is shallow and the resist layer is thick or the wafer is not flat, the mask pattern will not be in focus over the entire wafer. The size of the pattern that can be kept in focus (field width) tends to be inversely related to the resolution, so that a pattern smaller than the wafer must be used, which is then reexposed several times to cover the entire wafer.

Optical components also present difficulties because glass is not transparent to such short wavelengths. The quartz alternative now being tested does not transmit below 2000 angstroms, which sets the apparent ultimate limit for photolithography. The best commercially available instrument can replicate features as small as 1.25 micrometers. Engineers are divided on the likelihood of high-volume, production-line machines (as opposed to laboratory curosites) going much below this to the ultimate resolution of about 0.5 micrometer.

To reach below 1 micrometer use of x-rays or beams of electrons or ions has been proposed. X-ray lithography as previously proposed would work in much the same way as photolithography and thus is the logical next step: a beam of x-rays shining through a mask would expose a resist material. The intrinsic resolution could be quite high because of the short x-ray wavelength (soft x-rays with wavelengths ranging from about 4 to 50 angstroms are being investigated). But certain other difficulties limit the practical resolution to about 0.1 micrometer.

One of the factors is that x-ray resists, as previously proposed, do not work the same as photoresists, whose solubility in developing solutions is determined by structural changes in the resist induced by absorption of light by chemical bonds. In the case of x-rays, changes in resist follow from energy deposited by free electrons liberated by the absorption of the x-rays. The electrons can travel laterally in the resist and thereby expose a wider area than that which absorbed the x-rays.

A difficulty that further complicates x-ray lilthography is that resists take too long to be exposed to be practical for production lines when conventional x-ray tubes are used as sources. Sources with greater brightness would shorten exposure times. Alternatives being considered are electron storage rings that produce synchrotron radiation, high-energy laser or electron beams to produce intense bursts of x-rays when the beams vaporize a target material, and high-intensity, water-cooled, rotating and anode tubes. The method herein described, in a preferred form, uses relatively monochromatic soft X-ray at 4.5 m$\mu$ to generate auger electrons in the silver-halide grains. This provides a resolution only limited by dimension of the reduced silver grains. As 0.02$\mu$ silver-halide grains are available, this gives a resolution of about 0.1$\mu$. The resist is created by oxidation of the silver "image" to initiate other insoluble organic compounds, which can also provide a resolution of the order of 0.1$\mu$. Prior Art examples of x-ray lithography are to be found in U.S. Pat. Nos. 3,573,455; 3,707,372; 4,085,329; 4,028,547; 4,119,855 and 4,180,078. These prior art patents do not disclose or teach the concept of the present invention.

SUMMARY OF THE INVENTION

According to the present invention there is provided a method of producing a photoresist on a wafer material for use in the production of micro-electronic circuits comprising: coating the surface of the wafer with a carrier in which are disbursed silver halide crystals and exposing a desired portion of the coating to monochromatic X-rays having a wavelength to induce an inner shell ionization of the halide atoms with subsequent auger cascade, thereby to sensitize the silver halide crystals exposed to the monochromatic X-rays.

According to the present invention there is also provided a wafer for use in the production of micro-electronic circuits having a layer of material carrying silver halide crystals in suspension therein for the production of a photoresist layer to define the area of the wafer to be etched in the production of the micro circuits.

DETAILED DESCRIPTION OF THE INVENTION

The invention will now be described, by way of example, reference being made to the accompanying drawing.

Formation of Silver Image

Silver-halide crystals, typically the AbBr ionic crystal, are photosensitive. Photons of proper wavelength can reduce the silver ions to metallic silver. The photosensitivity of the silver-halide crystal as such, however, is vanishingly small in comparison to that of a typical silver-halide emulsion. With the help of silver-halide crystal defects, impurities, and various processes of development, an amplification of the photosensitivity by a factor greater than $10^9$ can usually be achieved. For an ideal ionic crystal, each ion has six nearest neighbors of the opposite charge in the bulk material, and five nearest neighbors on the surface where the continuation of one dimension is interrupted. The surface ions therefore have an inbalance of energy, with smaller crystals having greater surface-to-volume ratio and therefore greater amount of inbalance of energy per ion. Given a range of sizes of the silver-halide crystal in a solution of silver-halide during anneal (ripening), smaller crystals tend to dissolve into the solution while larger crystals tend to grow ever larger. The temperature and time of ripening are the key factors controlling the range of crystal sizes frozen in a gelatin gel. In a typical AgBr emulsion, the crystals may vary in size from 0.02 to several microns, and they are suspended in gelatin which isolates the crystal grains from one another but allowing developing agents to reach the crystals for various chemical processes. During development silver ions of the entire crystal as well as some in the solution nearby may be reduced to a metallic state, implying that once sensitized with a few atoms of metallic silver, larger crystals give rise to larger formations of metallic silver and therefore larger amplification factor or faster exposure index.

Various defects and impurities of the crystal can enhance the photosensitivity. "Kink sites" of the crystal surface, for example, give $Ag^+$ 4 $Br^-$ neighbors, while a "jog" gives only 3 $Br^-$ neighbors. Iodine can replace bromine in a AgBr crystal, but with an ionic radius 10% larger, the presence of $I^-$ deforms the AgBr crystal. Certain chemical impurities outside the crystal can also enhance the sensitivity. Compounds of labile sulphur where the sulphur can be readily abstracted, is added during manufacture to form extremely minute amount of silver sulphide as "sensitivity specks" on the grain surface. Soluable gold compounds can form metallic gold or gold sulphide at the sensitivity center to make the exposed grain more developable.

During exposure, photoelectrons reduce $Ag^+$ to metallic Ag and $Br^-$ diffuse through the crystal as hole to be neutralized by gelatin which surrounds and isolates each crystal. If the exposure time is very short, shorter than the diffusion processes, some latent images may be trapped internally in the crystal defects and unreachable by the developing agents during development. If the exposure time is too long, however, certain neutralizing processes designed to reduce fog may end up reducing the "pre-latent" image point instead. During development, surfaced of the grain with $Br^-$ and the gelatin is negatively charged. At the sensitivity speck, with a few metallic silver as latent image, the charge barrier to the absorption of the developing species is much lower and initiates contact for further chemical reduction. Metallic silver begin to form a lattice, and conduct electrons deep from the lattice for further reduction. The metallic silver network therefore becomes the center of an autocatalytic process, continues until all the ionic silver nearby as well as in the crystal are reduced.

Silver Photoresist

In making of a photoresist, the limiting resolution is the diffraction of the activating photons, which for UV at $0.4\mu$ and for deep UV at $\geq 0.2\mu$, possibly give rise to a line resolution at about twice the photon wavelength. This disclosure considers a line resolution of about $0.1\mu$ with conventional silver-halide crystals of a size about $0.02\mu$ and irradiating them with a beam of soft X-ray photons with a wavelength at about 45 Å.

Auger electrons from the L-shell ionization of chlorine or from the M-shell ionization of bromine have a kinetic energy of about 100 eV and a range in gelatin of about 50 Å. This implies that with a beam of X-ray photons of about 0.28 KeV, it will induce a latent image from the exposed fine grains of silver-halide, but not from those grains more than 50 Å away from the beam path. Photoelectrons are also of low energy and therefore of small range. The present invention uses a relatively monochromatic X-ray beam for a resonant absorption of the silver-halide grains. The total photoabsorption cross section for soft X-ray photons is virtually the same as that of the total attenuation cross section, therefore, the multiple photoscattering is small comparing to the first order photoabsorption and the photoelectrons derived from the secondary photoscattering can be ignored. An electron beam from conventional sources would suffice to initiate the exposure of a master artwork, which then becomes a negative of the photomask. The present invention then uses a beam of unfocused soft X-ray passing through the transparent areas of the negative to sensitive the silver-halide for the desired silver photoresist mask.

Photosensitivity involves intrinsically the absorption of photons, and the photoabsorption cross section reduces by a little more than three orders of magnitude for every ten fold increase of photon energy. From UV at $0.4\mu$ to soft X-ray at 45 Å, the photoabsorption cross section is reduced by about six orders of magnitude. The resonant absorption of the L and the M-edges help to bring back the cross section by about a factor of seven, and the fact that the low energy electrons responsible for the activating of silver-halide grains can be induced from the photosensitive material itself helps also to improve the efficiency. By far, the largest factor in forming a silver image with limited irradiation is the amplification factor during development, where even with very small grains, the amplification may exceed $10^5$. In current practice, the exposure time becomes a critical issue only when a non-silver process is irradiated with photons at greatly reduced wavelength. The present invention concentrates on the silver-halide process in this disclosure and uses a certain line-spectrum in the X-ray tube instead of the bremsstrahlung to increase the photon flux at the desired energy window by perhaps two orders of magnitude. An increase in the thickness of the emulsion in order to place more photosensitive grains in the beam path can also improve the exposure efficiency. A pre-exposure may also be used to reduce the number of activating photons required produce an effective latent image point as can the use of a faster developer to increase the photoefficiency. These are but a few conventional techniques in photography to reduce the exposure time.

When chemical processes are used to reduce ionic silver to a metallic state suspended in a gelatin matrix, careful consideration must be given in order to avoid the introduction of undesired impurities into the silicon substrate. All the chemical processes thus far considered can be ambient temperature which is very low with respect to the typical diffusion processes in the silicon, and organic molecules for development, fixation, etc., are usually the derivatives of benzene; much too large to diffuse into the silicon substrate. In order to eliminate free silver ions to reach the substrate, a thin coating of simple organic compound containing C, H, N, and S, such as allyl thiourea, to provide labile sulphur to form sulphide complex with "strayed" silver, can be applied. Once the silver-halide crystals are sensitized and developed, the desired pattern of fine silver grains become suspended in a gelatin matrix while the unexposed silver-halide crystals can be dissolved with standard photographic chemistry. The fixation and the stop-fixing for permanence can also use standard organic chemical processes. There are a great wealth of well developed information that one can draw upon and this will not be repeated then here.

Silver Induced Photoresist

Photoresist material, or simply the resists, are a layer of material formed due to irradiation and can be processed without affecting the unexposed areas. A negative resist is one that produces a resist pattern corresponding to the transparent areas of the photomask while a positive resist produces a pattern that corresponds to the unexposed area. The action of irradiation is generally to alter the solubility of the resist in various developing solvents. Silver-halide crystals or the developed silver-grains themselves are not proper candidates for the resists because they are suspended in gelatin and do not form a protective shield chemically to isolate the substrate from the reach of chemical etching. A good resist must have high photosensitivity such that the exposure time would not be too long, and can form a pinhole-free film in order to carry out the desired shielding of the chemical reactions free from pinhole-free etching pits. The use of ethyl chloride or diazonium salts for the photopolymerization materials imply that one can also use the chlorine auger electrons generated from the irradiation of the L-shell resonant absorption to improve the photoefficiency of the resists. Without the amplification factor during development of silver-halide, however, even a limited amplification for very small grains, the photon density required for a limited time of exposure can still be prohibitively large. The present invention therefore, makes, use of the process of silver mask and try to change the isolated fine silver grains into a continuous layer of protective chemical resist.

The most obvious resist material to make use of is of course the gelatin itself. Gelatin is a protein with a molecular weight of the order of $10^5$. It has a sponge like structure microscopically. It cages the silver-halide while it influences the growth of the grain. At a slightly elevated temperature, the formation of the cross-links between adjacent amino-acid spines of the protein breaks and the material dissolves into a solution of gelatin chains. In a gel form, it embraces continuous interstices capable of penetration by water molecules which can increase the inter-chain distance to make the gelatin swell. Various simple chemicals can alter the physical property of gelatin. High pH makes it soft, ammonium thiocyanate ($NH_4CNS$) makes it swell, and formaldehyde (HCHO) links between adjacent gelatin chains and hardens it. In developing the exposed grains, one class of developer also reacts with gelatin while reducing the silver ions, and this invention makes use of this selective reaction with the gelatin proteins chains.

Developers containing mixtures of methol and hydroquinone of phenidone and hydroquinone are most popular throughout the ages. The developing agents owe their activity to the readiness to go over to a quinonoid structure by the loss of electrons:

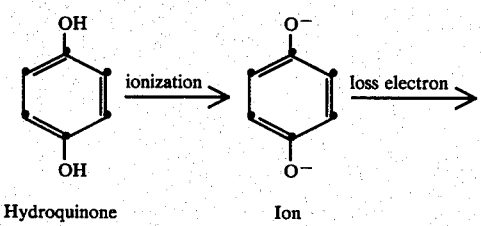

Hydroquinone      Ion

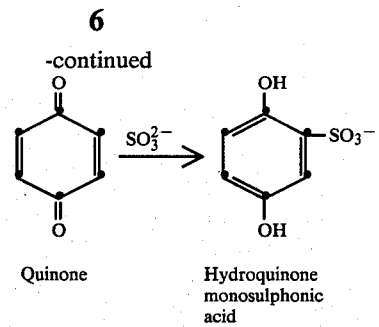

Quinone      Hydroquinone monosulphonic acid

A small variation in this class of developers is pyrogallol and amidol which also make the finished picture brown. They produce insoluable brown oxidation products which colors the image as well as human epidermis. The quinonoid oxidation products of pyrogallol, probably also amidol, contain chains of the quinone rings

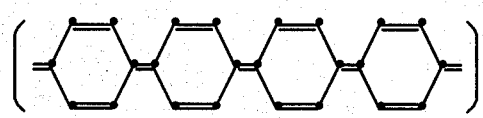

which also react with gelatin, thereby producing both the brown stain where there is developed silver and tanning, the local hardening of the gelatin. Undeveloped silver-halide crystals can be dissolved away as usual, and the un-hardened gelatin can be made into a sol in high pH together with a slightly elevated temperature. The remaining gelatin, in the desired pattern corresponding to the master artwork, can be further hardened by organic compounds such as formaldehyde in order to promote the cross-linking of the gelatin chains and thereby provide a protective shielding against the acid etching or plasma etching of the substrate. The hardened gelatin can always be dissolved away subsequently by compounds such as ammonium thiocyanate which inserts into the amino-acid spines.

Another possibility of forming the resist is the use of dyes. In color photography, sensitized silver-halide crystals are first reduced to silver grains in a gelatin while the developing agent forms developer oxidation products which, together with the added color couplers, form dyes. Each sensitized grain gives rise to a roughly spherical dye cloud centered on the crystal and, after the unwanted silver has been bleached and removed in the usual color development, only the dye clouds remain. The dye clouds are in general bigger than the developed grains and can have various possible characteristics that are designed into the basic structure. The general formula of color developing agent can be written:

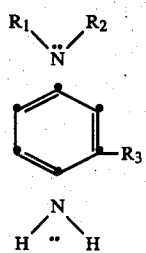

where $R_1$ is usually an ethyl radical, $R_2$ is ethyl, $\beta$-hydroxyethyl, or $\beta$-methylsulphonamidoethyl, and $R_3$ is either hydrogen or methyl. Variation of $R_2$ effects particularly its ease of gelatin penetration and its water of oil solubility. If $R_2$ is ethyl, for example, the molecule is much more grease soluble than $\beta$-hydroxyethyl. $R_3$ is of chemical interest in the developing characteristics. The fact that we are not interested in the color spectrum as such, we have great freedom in the use of dye couplers to make the dye adhere to the substrate or simply to dissolve away with the gelatin. The gelatin matrix in an untreated form, can easily be made into a sol if desired. Much of the dye chemistry have not been considered in detail here. But what is clear in this disclosure is that the localized auger electrons are an effective mean to sensitize the silverhalide crystals, and once sensitized, the sensitivity amplification during development can make up for the loss of the reduced photo absorption cross section with photons at shorter wavelength.

The structure and formation of a photoresist on a silicon wafer will now be described with reference to the aforementioned drawing. A silicondioxide layer 1 is formed over a silicon wafer 2 and this dioxide layer is then coated with a photoresist material consisting of silver-bromide crystals suspended in gelatin. Predetermined areas of the photoresist layer 3 are then exposed to a relatively monochromatic X-ray beam 4 with the areas of the layer 3 which are not to be exposed protected from exposure to the X-rays 4 by a mask 5. The X-rays 4 may be produced in a conventional manner as will be well known from the prior art and the mask 5 consists of material opaque to the X-rays utilized, this material being chosen in accordance with common general knowledge of the prior art.

The radiation of the silver-bromide by the monochromatic X-rays on the K-edge of the atoms of bromine will produce an inner shell ionization leading to an auger cascade ejecting electrons from the atoms, these electrons resulting in exposure of the silver grains consistent with photographic development to produce a desired image to permit appropriate production of a photoresist.

In the manner described above the X-rays will induce a latent image defined by the exposed grains of silver-bromide in the photoresist layer 3 and the exposed grains are then developed as previously discussed to form a desired pattern of silver grains suspended in a gelatin matrix, the unexposed silver-bromide crystals and the un-hardened gelatin in which they are suspended then being dissolved as previously discussed. The remaining gelatin in the desired pattern may then be further hardened by organic compounds as previously discussed thereby to provide a protective shielding against the acid etching or plasma etching of the silicon wafer 2.

The silver bromide grains are preferably 0.02 micron in size with the X-rays having a wavelength of 45 angstrom thereby to cause an auger cascade of electrons in the bromine atoms of the silver-bromide exposed to the X-rays and the consequent emission of auger electrons thereby to sensitize the photosensitive grain. The production of suitable monochromatic X-rays to induce the desired auger cascade in the bromine and not in the other elements present in the photoresist layer or the silicon wafer will be well known to those skilled in the art and may, for example, involve the control of the maximum energy level of the X-ray generator coupled with appropriate filtering, the use of appropriate secondary emission materials, X-ray diffraction etc.

The size is 0.02 microns is given for the silver-bromide grains as this is the smallest silver-bromide grain currently available in commercial quantities. Smaller grain sizes are expected to be available in the future and it will be appreciated that this preferred size is not regarded as limiting on the present invention. A useful range of silver-bromide grain sizes is 0.0045 microns to 0.5 microns, with the lower limit being determined by the smallest grain size which will produce an effective result and the higher limit by the maximum grain size which will produce presently acceptable definition of the developed image.

It will be appreciated that while the specific examples given above refer to negative photoresists, a positive photoresist, in which the gelatin in the unexposed portion of the photoresist is rendered non-soluble with the remainder of the layer being dissolved away to expose the desired portion of the wafer, falls within the scope of the present invention.

Although the preferred embodiment has been described with reference to silver-bromide, it will be appreciated that with appropriate changes in X-ray frequency etc., silver iodide or silver chloride might be utilized to form the photoresist. Additionally, in appropriate circumstances, a combination of different silver-halides might prove advantageous.

I claim:

1. A method of producing a latent image on a wafer material for use in the production of micro-electronic circuits comprising: coating the surface of the wafer with a carrier in which are disbursed silver halide crystals and exposing a desired portion of the coating to monochromatic X-rays having a wavelength to induce an inner shell ionization of the halide atoms with subsequent auger cascade, thereby to sensitize the silver halide crystals exposed to the monochromatic X-rays.

2. A method according to claim 1, further comprising the step of developing the exposed silver halide crystals to form silver grains, thereby to produce a photoresist.

3. A method according to claim 2, further comprising the step of removing a portion of the photoresist layer to expose a desired portion of the surface of the wafer.

4. A method according to claim 3, wherein the carrier is gelatin and the gelatin in the exposed portion of the photoresist is rendered non-soluble, the remainder of the gelatin being dissolved away to expose the desired portion of the wafer.

5. A method according to claim 3, wherein the carrier is gelatin and the gelatin in the unexposed portion of the photoresist is rendered non-soluble with the remainder of the layer being dissolved away to expose the desired portion of the wafer.

6. A method according to claim 3, wherein the carrier is gelatin and a developer is chosen for development of the silver grains such that during the reduction to form the silver grains the gelatin in the exposed area of the photoresist is hardened to prevent dissolution of this portion of the gelatin when the unexposed area of the photoresist is dissolved away.

7. A method according to claim 6, wherein the developed silver grains are oxidized with the resulting silver oxide being dissolved away together with the nonhardened portion of the gelatin.

8. A method according to claim 1, wherein the carrier is gelatin and the silver-halide crystals are silver-bromide having a grain size in the range of 0.0045 microns to 0.5 microns, the monochromatic X-rays having a wavelength of 45 angstroms.

9. A method according to claim 8, wherein the exposed silver-bromide crystals are developed to form silver grains by the use of a developer which results in localized hardening of the gelatin in the exposed area of the layer, the silver grains then being oxidized for dissolution together with the non-exposed areas of the layer, to leave exposed desired areas of the wafer, the remaining area of the wafer being coated by the hardened gelatin which is impermeable to the materials to be used for etching the exposed surfaces of the wafer.

10. A method according to claim 1, wherein the wafer is a silicon wafer the surface of which has formed thereon a layer of silicon dioxide prior to coating by the carrier.

* * * * *